(12) United States Patent
Mizusawa et al.

(10) Patent No.: US 7,816,790 B2
(45) Date of Patent: Oct. 19, 2010

(54) SEMICONDUCTOR DEVICE HAVING LOW DIELECTRIC INSULATING FILM AND MANUFACTURING METHOD OF THE SAME

(75) Inventors: Aiko Mizusawa, Musashimurayama (JP); Osamu Okada, Hamura (JP); Takeshi Wakabayashi, Sayama (JP)

(73) Assignee: Casio Computer Co., Ltd., Tokyo (JP)

( * ) Notice: Subject to any disclaimer, the term of this patent is extended or adjusted under 35 U.S.C. 154(b) by 774 days.

(21) Appl. No.: 11/638,717

(22) Filed: Dec. 14, 2006

(65) Prior Publication Data

US 2007/0267743 A1 Nov. 22, 2007

(30) Foreign Application Priority Data

May 19, 2006 (JP) .............................. 2006-139821
Nov. 24, 2006 (JP) .............................. 2006-316643

(51) Int. Cl.
*H01L 23/48* (2006.01)

(52) U.S. Cl. ...................... 257/758; 257/210; 257/738; 257/759; 257/760; 257/E23.062

(58) Field of Classification Search ................. 257/758, 257/768, E23.02; 438/622
See application file for complete search history.

(56) References Cited

U.S. PATENT DOCUMENTS

| | | | |
|---|---|---|---|
| 6,476,491 B2* | 11/2002 | Harada et al. ................ | 257/758 |
| 6,770,971 B2* | 8/2004 | Kouno et al. ................ | 257/734 |
| 6,989,600 B2* | 1/2006 | Kubo et al. ................. | 257/758 |
| 7,042,081 B2* | 5/2006 | Wakisaka et al. ........... | 257/700 |
| 7,064,440 B2* | 6/2006 | Jobetto et al. ............... | 257/758 |

(Continued)

FOREIGN PATENT DOCUMENTS

JP 59-222954 A 12/1984

(Continued)

OTHER PUBLICATIONS

International Search Report and Written Opinion of the International Searching Authority, Dated May 4, 2007, for PCT/JP2006/325131, 14 sheets.

(Continued)

*Primary Examiner*—Zandra Smith
*Assistant Examiner*—Tsz K Chiu
(74) *Attorney, Agent, or Firm*—Holtz, Holtz, Goodman & Chick, PC

(57) ABSTRACT

A semiconductor device includes a semiconductor substrate and low dielectric film wiring line laminated structure portions which are provided in regions on the semiconductor substrate except a peripheral portion thereof. Each of the laminated structure portions has a laminated structure of low dielectric films and a plurality of wiring lines. An insulating film is provided on an upper side of the laminated structure portion. Connection pad portions for electrodes are arranged on the insulating film to be electrically connected to the connection pad portions of uppermost wiring lines of the laminated structure portion. Bump electrodes for external connection are provided on the connection pad portions for the electrodes. A sealing film is provided on the insulating film and on the peripheral portion of the semiconductor substrate. Side surfaces of the laminated structure portions are covered with the insulating film or the sealing film.

15 Claims, 17 Drawing Sheets

U.S. PATENT DOCUMENTS

| | | |
|---|---|---|
| 7,075,181 B2 * | 7/2006 | Wakabayashi et al. ...... 257/734 |
| 7,176,572 B2 | 2/2007 | Hanaoka |
| 7,294,922 B2 * | 11/2007 | Jobetto et al. ............... 257/700 |
| 7,294,933 B2 | 11/2007 | Hanaoka |
| 7,547,967 B2 * | 6/2009 | Jobetto et al. ............... 257/734 |
| 7,618,886 B2 | 11/2009 | Jobetto et al. |
| 2003/0148558 A1 * | 8/2003 | Kubo et al. ................. 438/128 |
| 2006/0012039 A1 | 1/2006 | Kim et al. |
| 2006/0060984 A1 | 3/2006 | Wakabayashi et al. |
| 2006/0186542 A1 | 8/2006 | Wakabayashi et al. |
| 2006/0273463 A1 | 12/2006 | Wakabayashi et al. |

FOREIGN PATENT DOCUMENTS

| | | |
|---|---|---|
| JP | 10-032220 A | 2/1998 |
| JP | 2002-217198 A | 8/2002 |
| JP | 2003-298005 A | 10/2003 |
| JP | 2004-158827 A | 6/2004 |
| JP | 2004-349461 A | 12/2004 |
| JP | 2005-173517 A | 6/2005 |
| JP | 2005-347461 A | 12/2005 |
| TW | 200405496 | 4/2004 |
| TW | 200614404 | 5/2006 |
| WO | WO 2005/024912 A2 | 3/2005 |
| WO | WO 2006/129832 A1 | 12/2006 |

OTHER PUBLICATIONS

Japanese Office Action (and English translation thereof) dated Jun. 17, 2008, issued in a counterpart Japanese Application.

Taiwanese Office Action dated Feb. 26, 2010 and English translation thereof in counterpart Taiwanese Application No. 095146789.

* cited by examiner

SEMICONDUCTOR DEVICE HAVING LOW DIELECTRIC INSULATING FILM AND MANUFACTURING METHOD OF THE SAME

CROSS-REFERENCE TO RELATED APPLICATIONS

This application is based upon and claims the benefit of priority from prior Japanese Patent Applications No. 2006-139821, filed May 19, 2006; and No. 2006-316643, filed Nov. 24, 2006, the entire contents of both of which are incorporated herein by reference.

BACKGROUND OF THE INVENTION

1. Field of the Invention

The present invention relates to a semiconductor device and a manufacturing method of the device.

2. Description of the Related Art

As conductor devices to be mounted on small-sized electronic devices represented by portable electronic devices and the like, there are known chip size packages (CSPs) each having dimensions substantially equal to that of a semiconductor substrate. Among the CSPs, a CSP in which packaging is completed in a wafer state and which is separated into individual semiconductor devices by dicing is also referred to as a wafer level package (WLP). In Jpn. Pat. Appln. KOKAI Publication No. 2004-349461, a typical structure of the WLP is disclosed. In the semiconductor device described in this prior literature, wiring lines are extended from connection pads on the upper surface of an insulating film which covers the connection pads formed on the semiconductor substrate except their central parts, columnar electrodes are arranged on the upper surfaces of connection pad portions formed on ends of the extended wiring lines, and a sealing film is formed so as to cover the wiring lines between the columnar electrodes on the upper surface of the insulating film. The sealing film is formed so that the upper surface of the sealing film and the upper surfaces of the columnar electrodes are on one plane. Solder balls are provided on the upper surfaces of the columnar electrodes.

Among such semiconductor devices as described above, there is a device in which interlayer insulating film wiring line laminated structure portions each including a laminated structure of interlayer insulating films and the wiring lines are provided between the semiconductor substrate and the insulating film. In this device, when an interval between the wiring lines of the interlayer insulating film wiring line laminated structure portion decreases with miniaturization of the semiconductor devices, a capacity between the wiring lines increases, with the result that a delay of a signal which transmits through the wiring lines increases.

To improve this point, as a material of the interlayer insulating film, much attention is paid to a low dielectric film such as a low-k material having a dielectric constant lower than a dielectric constant of 4.2 to 4.0 of silicon oxide which is generally used as the material of the interlayer insulating film. Examples of the low-k material include SiOC obtained by doping silicon oxide ($SiO_2$) with carbon (C), and SiOCH further containing H. To further lower the dielectric constant, air-containing porous type low dielectric films are also being investigated.

However, in the above semiconductor device including the low dielectric film, especially the low dielectric film represented by the porous type low dielectric film having a hollow structure has a small mechanical strength and is easily influenced by moisture. As a result, there is a problem that the low dielectric film easily peels from an underlayer.

BRIEF SUMMARY OF THE INVENTION

An object of the present invention is to provide a semiconductor device capable of remarkably improving a problem of peeling of a low dielectric film, and a manufacturing method of the semiconductor device.

A semiconductor device according to one aspect of the present invention comprises:

a semiconductor substrate;

a plurality of low dielectric film wiring line laminated structure portions which are provided in regions on the semiconductor substrate except a peripheral portion thereof, each of the low dielectric film wiring line laminated structure portions being constituted of a laminated structure of low dielectric films and a plurality of wiring lines including an uppermost wiring line having a connection pad portion;

an insulating film provided on an upper side of each of the low dielectric film wiring line laminated structure portions;

a plurality of connection pad portions for electrodes, arranged on the insulating film to be electrically connected to the connection pad portions of the uppermost wiring lines of the low dielectric film wiring line laminated structure portion;

a plurality of bump electrodes for external connection, provided on the connection pad portions for the electrodes; and a sealing film provided on the insulating film and on the peripheral portion of the semiconductor substrate, wherein side surfaces of each of the low dielectric film wiring line laminated structure portions are covered with one of the insulating film and the sealing film.

Moreover, a manufacturing method of a semiconductor device according to another aspect of the present invention comprises:

preparing a semiconductor wafer having, on one surface thereof, a first layer of low dielectric film wiring line laminated structure portions each constituted by laminating low dielectric films and a second layer of a plurality of wiring lines including an uppermost wiring line, and an insulating film formed on the low dielectric film wiring line laminated structure portions;

removing parts of the first and second layers in regions of dicing streets and regions on opposite sides of the dicing streets to form grooves, the grooves separating low dielectric film wiring line laminated structure portions and the insulating films from each other and exposing the side surfaces of the low dielectric film wiring line laminated structure portions and the side surfaces of the insulating films;

forming connection pad portions on the insulating film to be connected to the uppermost wiring lines;

forming bump electrodes for external connection on the connection pad portions; and forming a sealing film which covers an upper surface of the insulating film between the bump electrodes for external connection, side surfaces of the low dielectric film wiring line laminated structure portion, and the side surfaces of the insulating film.

According to the present invention, the region on the semiconductor substrate except its peripheral portion is provided with the low dielectric film wiring line laminated structure portion including the laminated structure of the low dielectric films and the wiring lines, and the side surfaces of this low dielectric film wiring line laminated structure portion are covered with the sealing film (or the insulating film). In consequence, the peeling of the low dielectric films can be prevented.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

DETAILED DESCRIPTION OF THE INVENTION

First Embodiment

Figure 1:
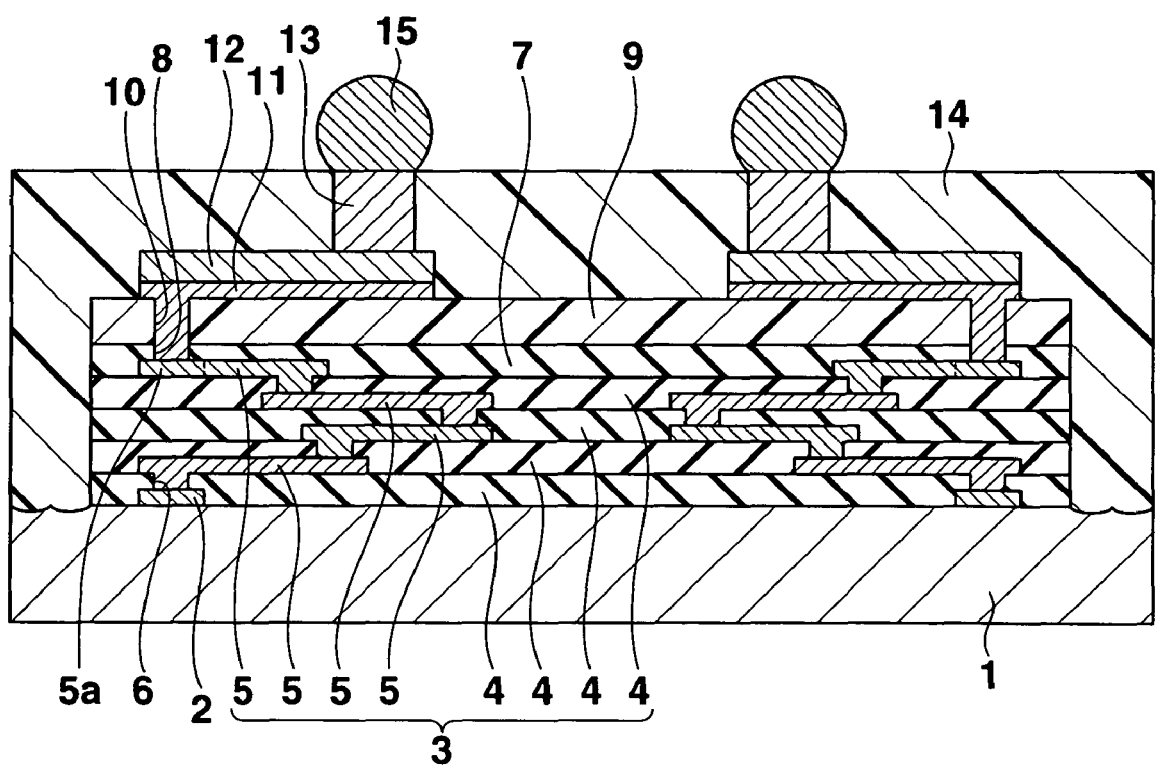
FIG. 1 is a sectional view of a semiconductor device as a first embodiment of the present invention.

FIG. 1 shows a sectional view of a semiconductor device as a first embodiment of the present invention. This semiconductor device includes a silicon substrate (a semiconductor substrate) 1. On the upper surface of the silicon substrate 1, an integrated circuit having a predetermined function is provided, and in a peripheral portion of the upper surface, a plurality of or large number of connection pads 2 made of an aluminum-based metal or the like are electrically connected to the integrated circuit, although the figure shows only two pads.

On the upper surfaces of the silicon substrate 1 and the connection pads 2, low dielectric film/wiring line/laminated structure portions 3 are provided. The laminated structure portion 3 has a structure in which there are alternately laminated a plurality of layers, for example, four layers of low dielectric films 4 and the same number of layers of wiring lines 5 made of an aluminum-based metal or the like. Examples of a material of the low dielectric films 4 include ethylene fluoride, polyimide fluoride, polyolefin, polyimide resin to which fillers are added, benzocyclobutene (BCB) and an organic polymer-based low-k material. The materials having a relative dielectric constant of 1.5 to 3.9 can be used, and especially the materials having a relative dielectric constant of 2.5 to 3.9 can preferably be used.

The wiring lines 5 corresponding to the connection pad are electrically connected to each other between the adjacent layers. One end portion of the wiring line 5 of the lowermost layer is electrically connected to the connection pad 2 via an opening 6 provided in the low dielectric film 4 of the lowermost layer. Connection pad portions 5a of the wiring lines 5 of an uppermost layer are arranged on upper surface peripheral portions of the low dielectric films 4 of the uppermost layer, respectively.

A passivation film 7 made of an inorganic material such as silicon oxide or a low dielectric material is provided on the upper surfaces of the uppermost wiring lines 5 and the low dielectric films 4 of the uppermost layer. Openings 8 are formed through the passivation film 7 in portions corresponding to the connection pad portions 5a of the wiring lines 5 of the uppermost layer. On the upper surface of the passivation film 7, there is provided a protective film 9 made of an organic material containing polyimide, epoxy, phenol, bismaleimide, acryl, synthetic rubber, polybenzoxide or the like as a main component. Openings 10 are formed through the protective film 9 in portions corresponding to the openings 8 of the passivation film 7.

On the upper surface of the protective film 9, metallic underlayers 11 made of copper or the like are provided. On the whole upper surface of each of the metallic underlayers 11, an upper layer wiring line 12 made of copper is provided. End portions of the metallic underlayers 11 are electrically connected to the connection pad portions 5a of the wiring lines 5 of the uppermost layer via the openings 8, 10 of the passivation film 7 and the protective film 9. On the upper surfaces of connection pad portions of the upper layer wiring lines 12, there are provided bump electrodes or columnar electrodes 13 for external connection made of copper.

On the upper surfaces of the upper layer wiring lines 12 and the protective film 9, and the upper surface of the peripheral portion of the silicon substrate 1, there is provided a sealing film or layer 14 made of an organic material such as an epoxy-based resin so that the upper surface of the sealing film and the upper surfaces of the columnar electrodes 13 are on one plane. In this state, the side surfaces of the low dielectric film wiring line laminated structure portion 3, the passivation film 7 and the protective film 9 are entirely covered with a portion of the sealing film 14 on the upper surface of the silicon substrate 1. Solder balls 15 are provided on the upper surfaces of the columnar electrodes 13.

As described above, in this semiconductor device, a region on the silicon substrate 1 except the peripheral portion is provided with the low dielectric film wiring line laminated structure portion 3 each including the laminated structure of the low dielectric films 4 and the wiring lines 5, and the side surfaces of the low dielectric film wiring line laminated structure portion 3, the passivation film 7 and the protective film 9 are covered with the sealing film 14. Therefore, the low dielectric film wiring line laminated structure portion 3 does not easily peel from the silicon substrate 1.

Figure 2:
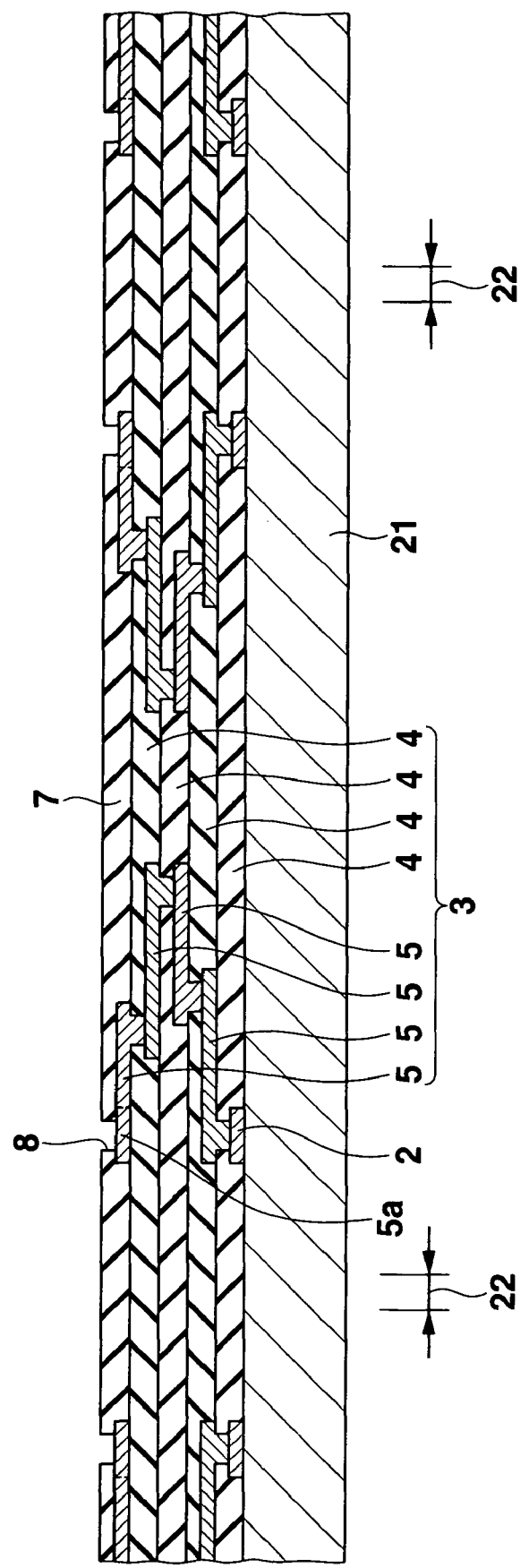
FIG. 2 is a sectional view of an assembly first prepared during manufacturing of the semiconductor device shown in FIG. 1.

Next, one example of a manufacturing method of the semiconductor device having an aforementioned construction will be described. First, as shown in FIG. 2, an assembly is prepared in which on a silicon substrate (hereinafter referred to as a semiconductor wafer 21) having a wafer state, there are arranged the connection pads 2 and the low dielectric film wiring line laminated structure portions 3 each including four layers of low dielectric films 4 and wiring lines 5, respectively. In the assembly, the passivation film 7 is provided on the laminated structure portions 3, and the centers of the connection pad portions 5a of the wiring lines 5 of the uppermost layer are exposed via the openings 8 provided in the passivation film 7. Examples of a low dielectric film material include ethylene fluoride, polyimide fluoride, polyolefin, polyimide resin to which fillers are added, benzocyclobutene (BCB) and an organic polymer-based low-k material. The material having a relative dielectric constant of 1.5 to 3.9 may be used, and especially the material having a relative dielectric constant of 2.5 to 3.9 can preferably be used. It is to be noted that regions denoted with reference numeral 22 in FIG. 2 are regions corresponding to dicing streets.

Figure 3:
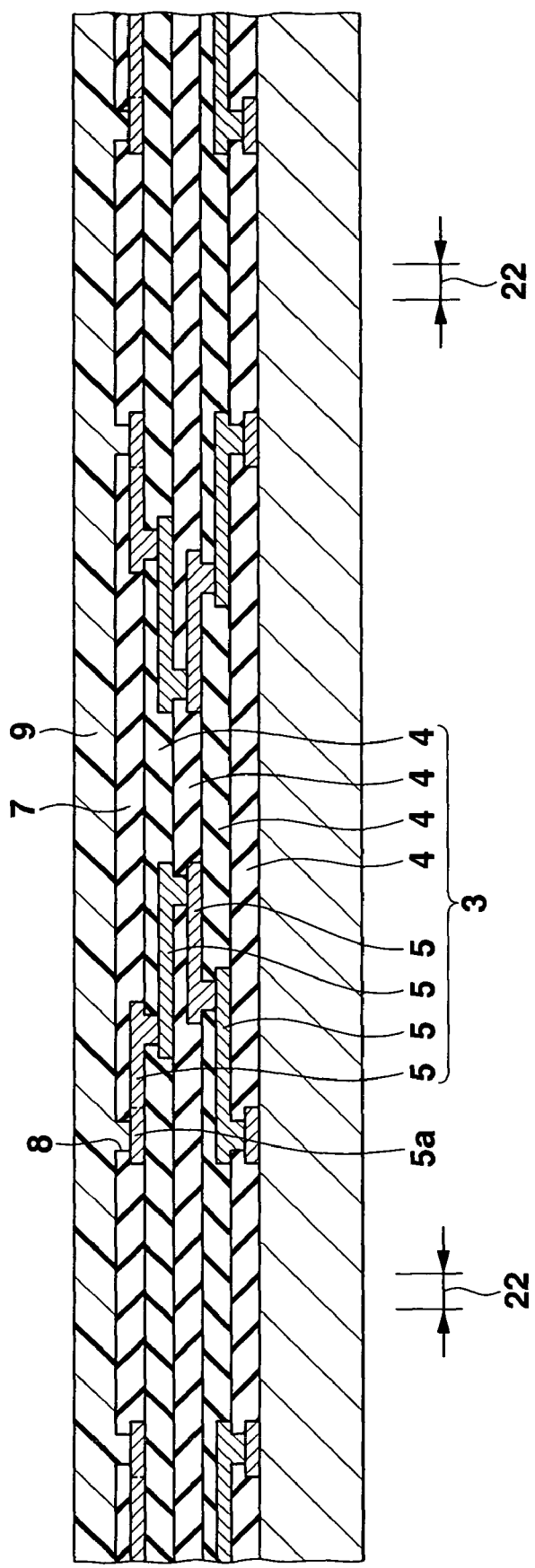
FIG. 3 is a sectional view of an assembly in a step subsequent to FIG. 2.

Next, as shown in FIG. 3, by a screen printing process, a spin coating process or the like, the protective film 9 made of an organic material such as a polyimide-based resin is formed on the upper surface of the passivation film 7 and the upper surfaces of the connection pad portions 5a of the wiring lines 5 of the uppermost layer exposed via the openings 8 of the passivation film 7.

Figure 4:
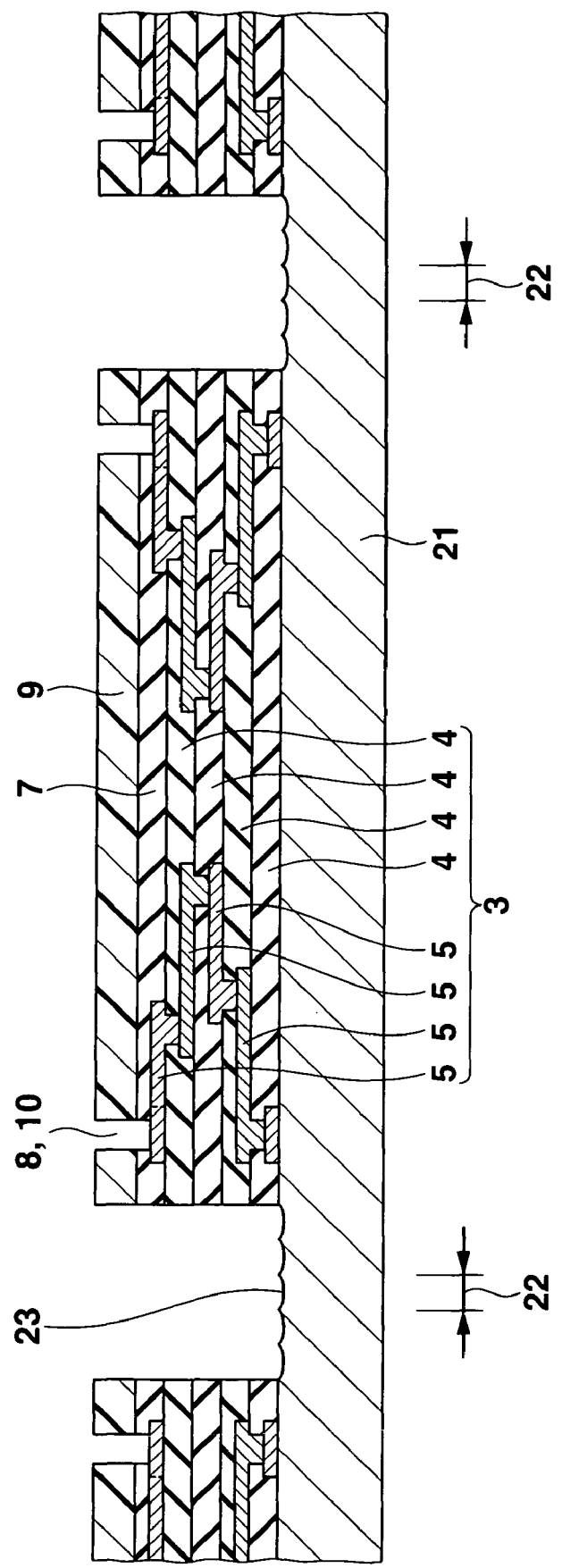
FIG. 4 is a sectional view of an assembly in a step subsequent to FIG. 3.

Next, as shown in FIG. 4, by laser processing which emits a laser beam, there are removed portions of the protective film 9, the passivation film 7 and four layers of the low dielectric films 4 positioned in regions of the dicing streets 22 and regions on opposite sides of the streets to form latticed grooves 23. Thus, the upper surface of the silicon substrate 1 is exposed in a lattice form through the grooves. The openings 8 are made in portions of the passivation film 7 on the connection pad portions 5a, and the openings 10 are made in portions of the protective film 9 on these openings. The low dielectric films 4 are brittle. Therefore, if the grooves 23 are cut in the films 4 by using a blade, the cut surface of the low dielectric films 4 will have many notches and cracks. In view of this, it is recommended that the laser beam be applied to the cut surface to make grooves 23. When irradiated with the laser beam, the upper surface of the silicon substrate 1 melts, and molten silicon particles jump and then fall onto the silicon substrate 1. Inevitably, each groove 23 will have an uneven bottom surface as shown in FIG. 4. The application of the laser beam may be terminated when the grooves 23 reach the field oxide film (not shown) that is formed, as in most cases, on the silicon substrate 1.

In this state, the upper surface of the semiconductor wafer 21 in the regions of the dicing streets 22 and the regions on opposite sides of the streets is exposed via the grooves 23 as described above. Moreover, portions of the four layers of the low dielectric films 4, the passivation film 7 and the protective film 9 laminated on the semiconductor wafer 21 are separated from one another by the grooves 23. In consequence, a plurality of low dielectric film wiring line laminated structure portions 3 independent of one another are formed on the wafer 21.

As one example, a width of the groove 23 is 10 to 1000 μm×2 plus a width of the dicing street (a dicing cutter) 22. As a result, in the completed device shown in FIG. 1, a width of the portion of the sealing film 14 which covers the side surfaces of the low dielectric film wiring line laminated structure portion 3, the passivation film 7 and the protective film 9 is 10 to 1000 μm.

Figure 5:
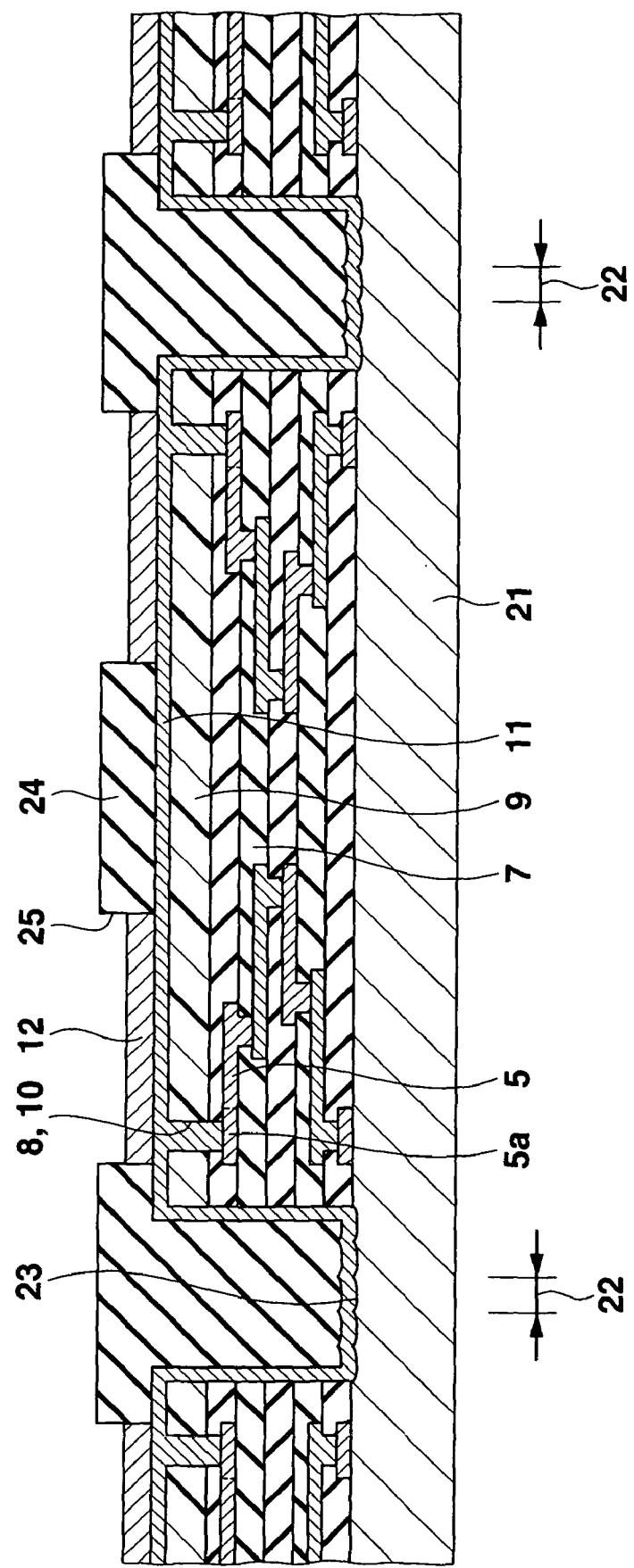
FIG. 5 is a sectional view of an assembly in a step subsequent to FIG. 4.

Next, as shown in FIG. 5, the metallic underlayers 11 are formed on the upper surfaces of the connection pad portions 5a of the wiring lines 5 of the uppermost layer exposed via the openings 8, 10 of the passivation film 7 and the protective film 9, on the portions of the upper surface of the semiconductor wafer 21 exposed via the grooves 23, and on the whole upper surface of the protective film 9. In this case, the metallic underlayers 11 may be formed by an only copper layer formed by electroless plating, an only copper layer formed by sputtering, or a copper layer formed by the sputtering on a thin film layer of titanium or the like formed by the sputtering.

Next, plating resist films 24 are formed on the upper surfaces of the metallic underlayers 11, and followed by patterning. As a result, openings 25 are formed in portions of the plating resist films 24 corresponding to regions in which the upper layer wiring lines 12 are formed. Next, electrolytic plating of copper is performed by use of the metallic underlayers 11 as plating current paths to thereby form the upper layer wiring lines 12 on the upper surfaces of the metallic underlayers 11 in the openings 25 of the plating resist films 24. Next, the plating resist films 24 are peeled.

Figure 6:
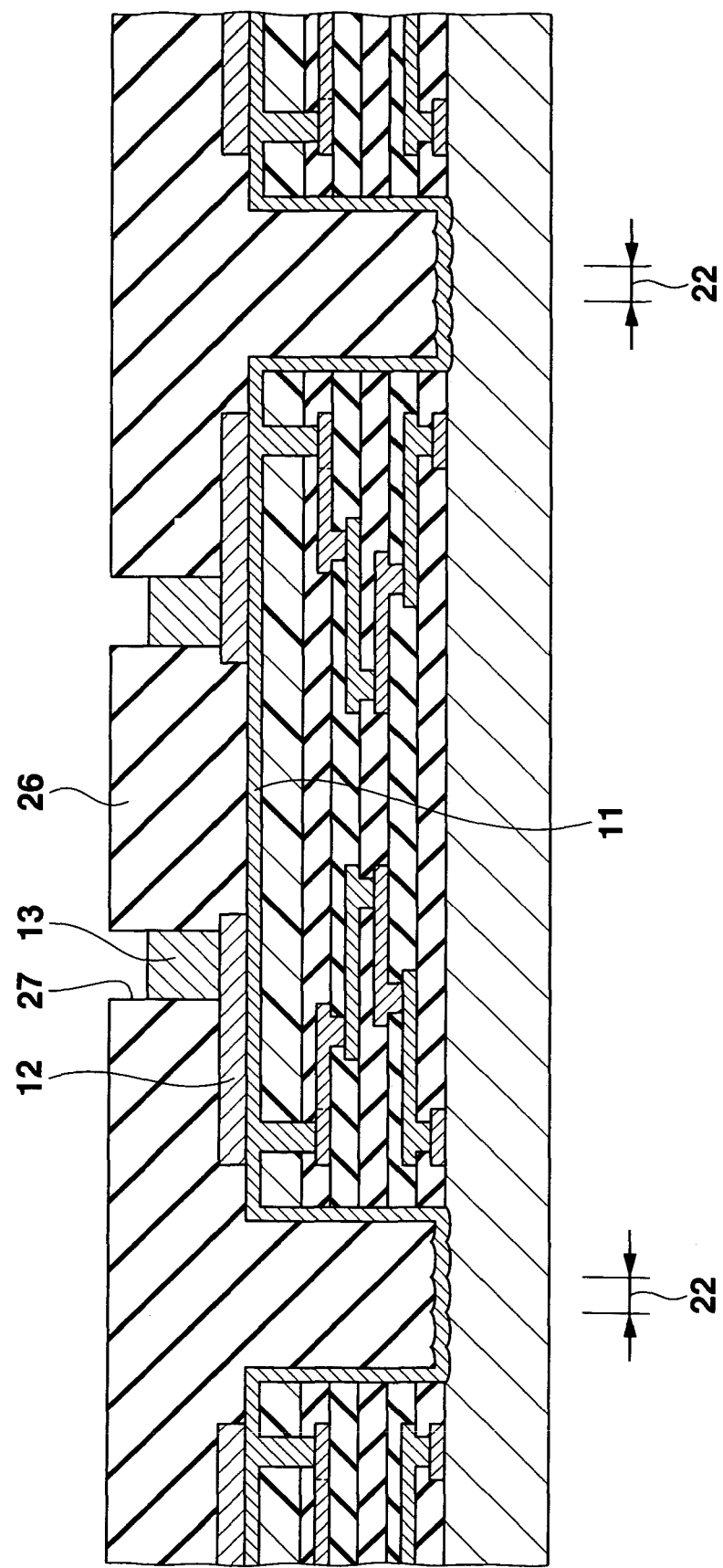
FIG. 6 is a sectional view of an assembly in a step subsequent to FIG. 5.
Figure 7:
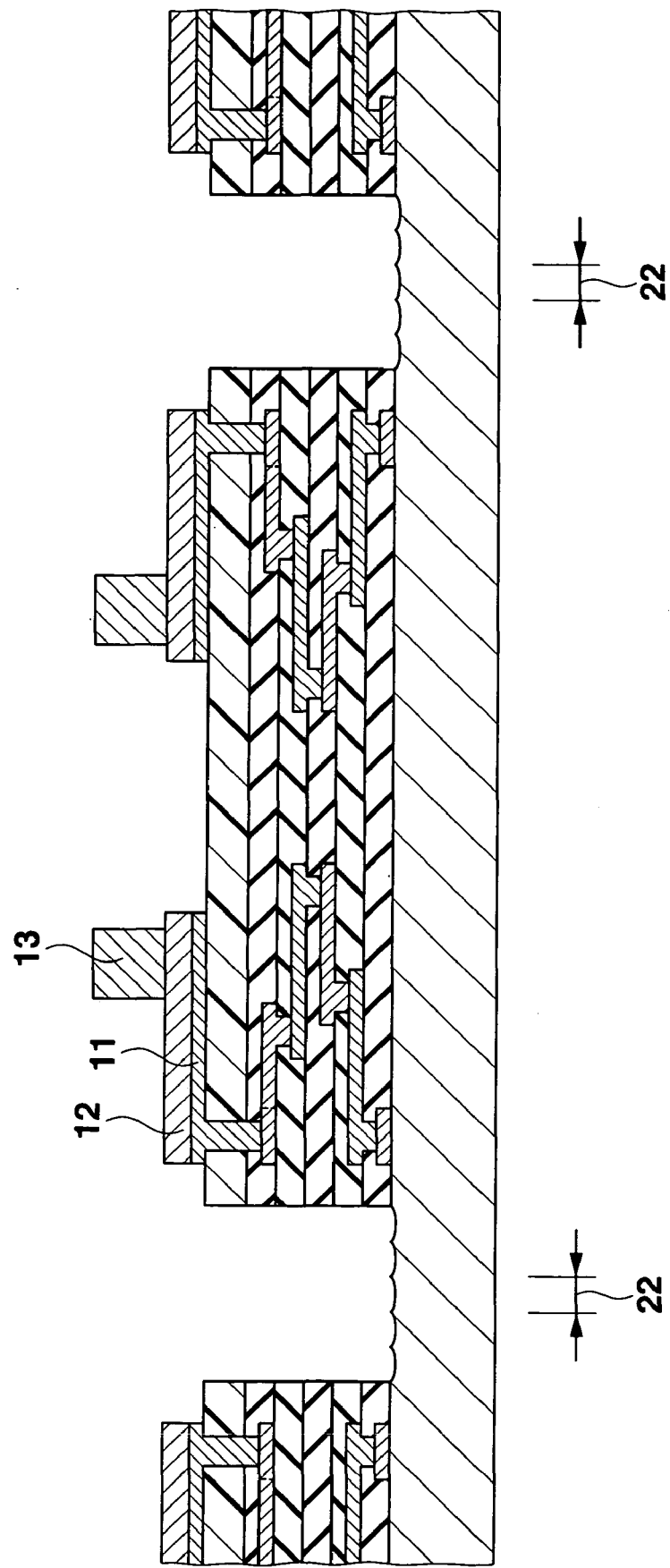
FIG. 7 is a sectional view of an assembly in a step subsequent to FIG. 6.

Next, as shown in FIG. 6, on the upper surfaces of the metallic underlayers 11 and the upper layer wiring lines 12, a plating resist film 26 is formed by depositing and then patterning. Thus, this case, openings 27 are formed in the plating resist film 26 in portions corresponding to the connection pad portions (regions where the columnar electrodes 13 are formed) of the upper layer wiring lines 12. Next, the electrolytic plating of copper is performed by use of the metallic underlayers 11 as the plating current paths, whereby the columnar electrodes 13 each having a height of 50 to 150 μm are formed on the upper surfaces of the connection pad portions of the upper layer wiring lines 12 in the openings 27 of the plating resist film 26. Next, the plating resist film 26 is entirely peeled or removed. Then, unnecessary portions of the metallic underlayers 11 are etched and removed by use of the upper layer wiring lines 12 as masks. Consequently, as shown in FIG. 7, the metallic underlayers 11 only under the upper layer wiring lines 12 are left.

Figure 8:
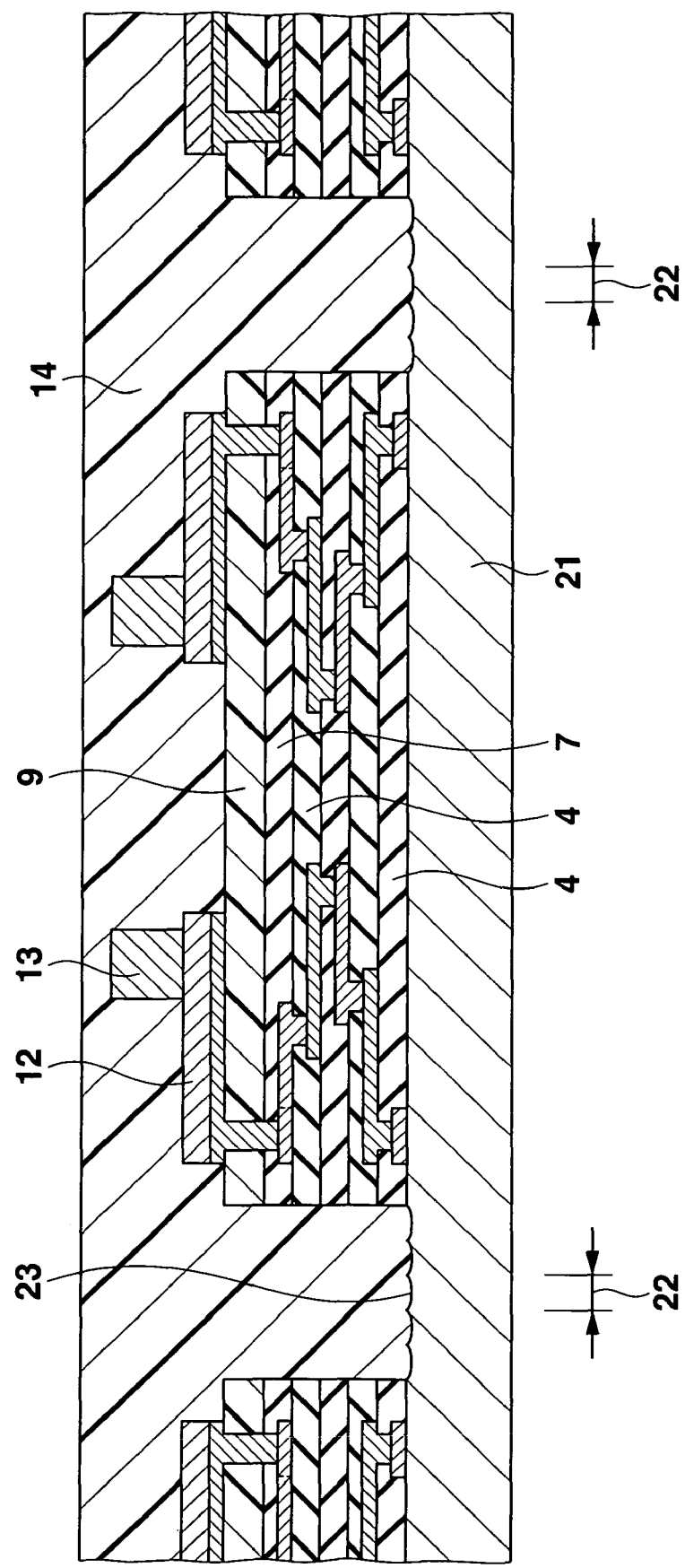
FIG. 8 is a sectional view of an assembly in a step subsequent to FIG. 7.

Next, as shown in FIG. 8, by a screen printing process, a spin coating process or the like, the sealing film 14 made of an organic material such as an epoxy-based resin is entirely formed on the upper surfaces of the upper layer wiring lines 12, the columnar electrodes 13 and the protective film 9, as well as on the upper surface of the semiconductor wafer 21 exposed via the grooves 23 so that a thickness of the sealing film 14 is larger than a height of the columnar electrodes 13. Therefore, in this state, the upper surfaces of the columnar electrodes 13 are covered with an upper part of the sealing film 14. The side surfaces of the protective film 9, the passivation film 7 and four layers of the low dielectric films 4 are also entirely covered with the sealing film 14.

Figure 9:
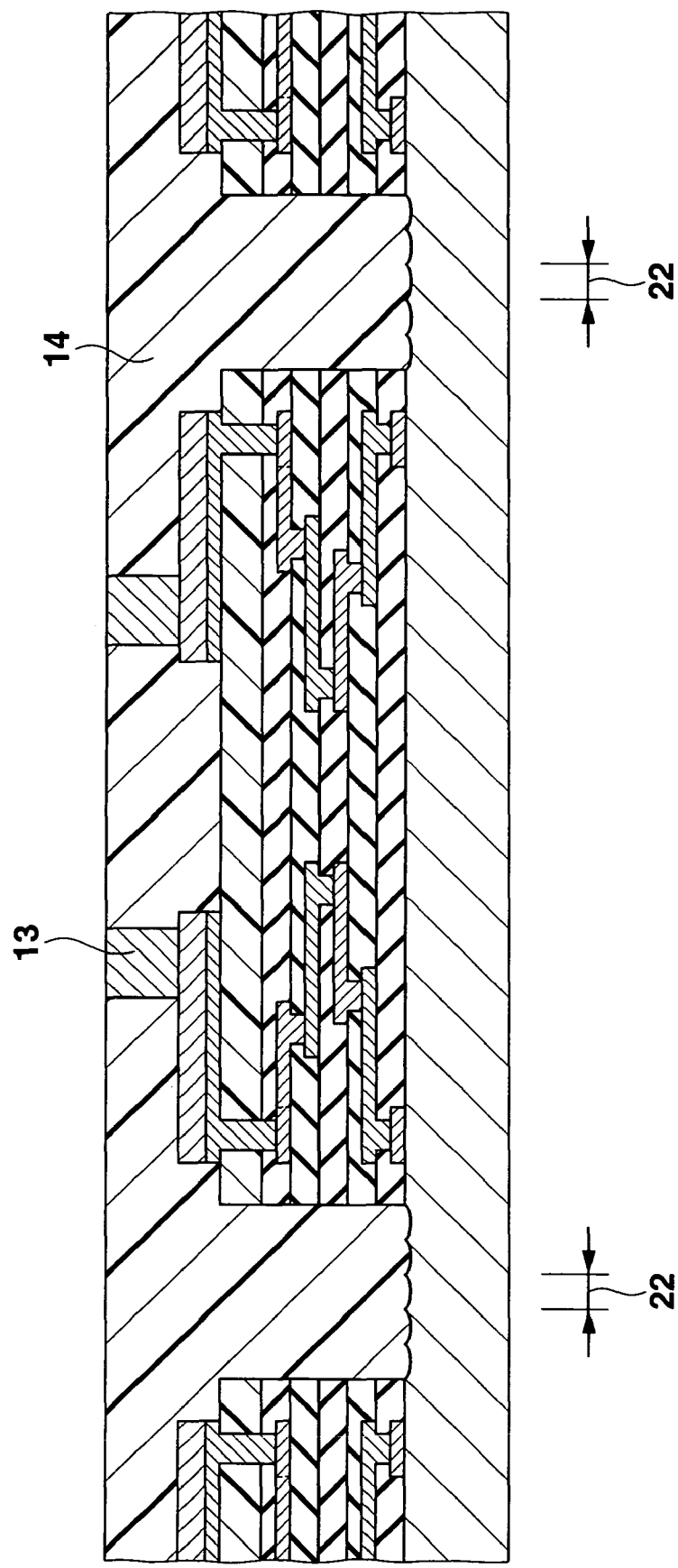
FIG. 9 is a sectional view of an assembly in a step subsequent to FIG. 8.
Figure 10:
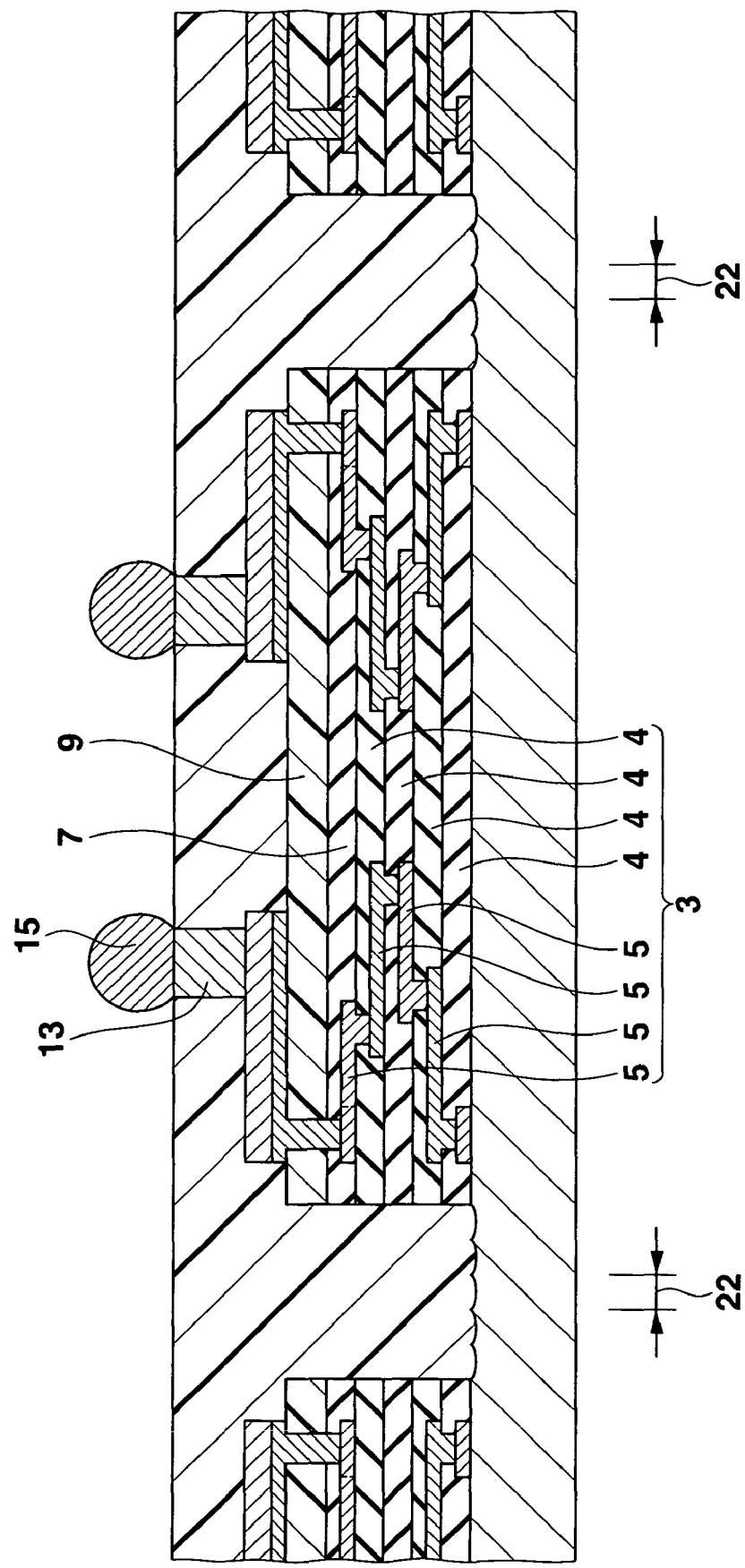
FIG. 10 is a sectional view of an assembly in a step subsequent to FIG. 9.
Figure 11:
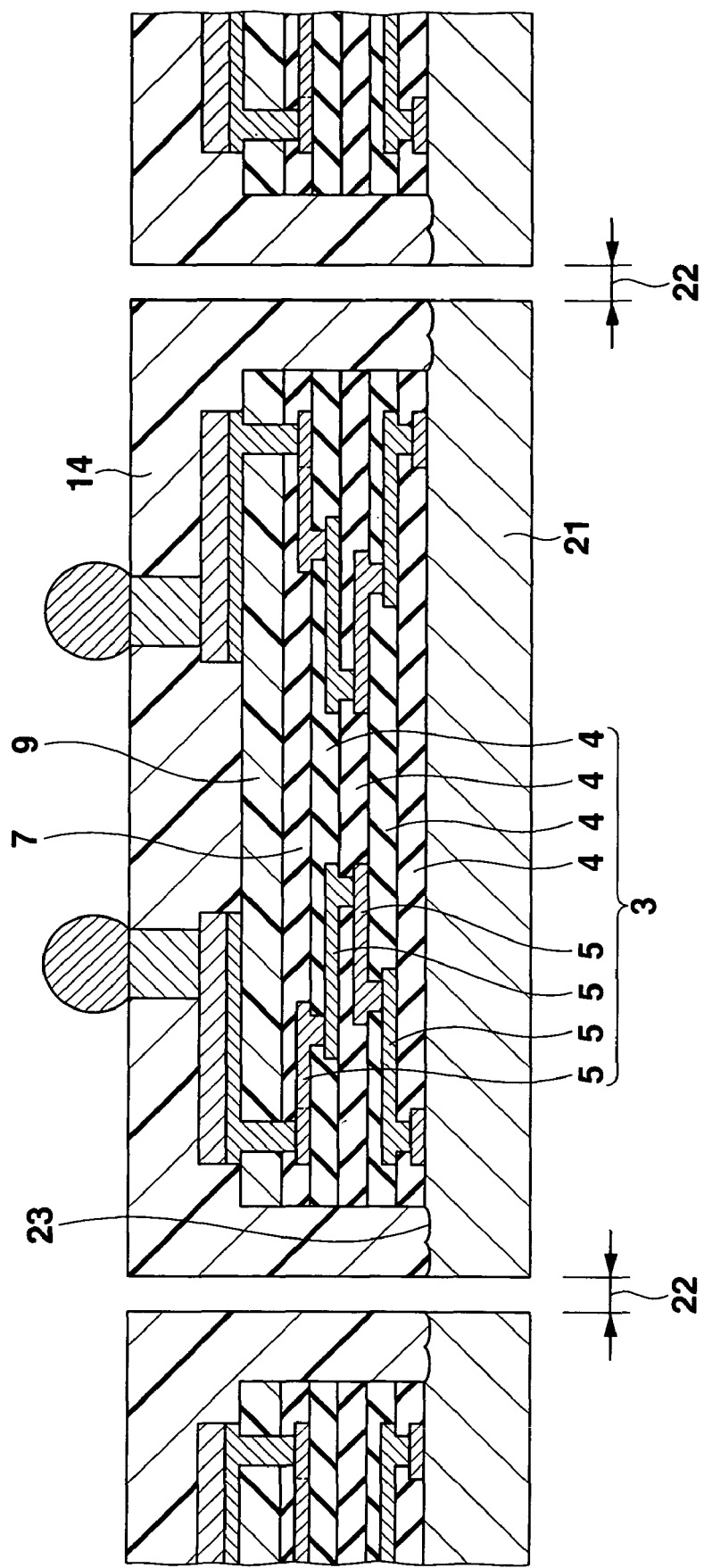
FIG. 11 is a sectional view of an assembly in a step subsequent to FIG. 10.

Next, a portion of the upper surface of the sealing film 14 is appropriately ground to expose the upper surfaces of the columnar electrodes 13 as shown in FIG. 9. Moreover, the exposed upper surfaces of the columnar electrodes 13 and the upper surface of the sealing film 14 are flattened so that these upper surfaces are on one plane. In flattening this upper surface of the sealing film 14, upper surface portions of the columnar electrodes 13 may be ground together with the upper portion of the sealing film 14 as much as several to ten or more micrometers. Next, as shown in FIG. 10, the solder balls 15 are formed on the upper surfaces of the columnar electrodes 13. Next, as shown in FIG. 11, the sealing film 14 and the semiconductor wafer 21 are cut along the dicing streets 22 in the centers of the grooves 23. As described above, since the grooves 23 have been formed to be wider than the dicing streets 22, there are obtained a plurality of semiconductor devices each having a structure in which, as shown in FIG. 1, the side surfaces of the low dielectric film wiring line laminated structure portion 3 are covered with the sealing film 14, and further the side surfaces of the passivation film 7 and the upper surface and the side surfaces of the protective film 9 are also covered with the sealing film 14.

In the above embodiment, the exposed part of the upper surface of the semiconductor wafer 21 is shown like a bottom portion of the groove 23, but the upper surface of the semiconductor wafer 21 may be partially removed by a laser beam to form the groove 23, so that the bottom portion of the groove 23 may be below the upper surface of the semiconductor wafer 21. If an insulating film such as a field oxide film is formed on the upper surface of the semiconductor wafer 21, the upper surface of this field oxide film or an intermediate portion of a film thickness thereof may be the bottom portion of the groove 23, and the bottom portion of the groove 23 may be positioned above the upper surface of the semiconductor wafer 21.

Second Embodiment

Figure 12:
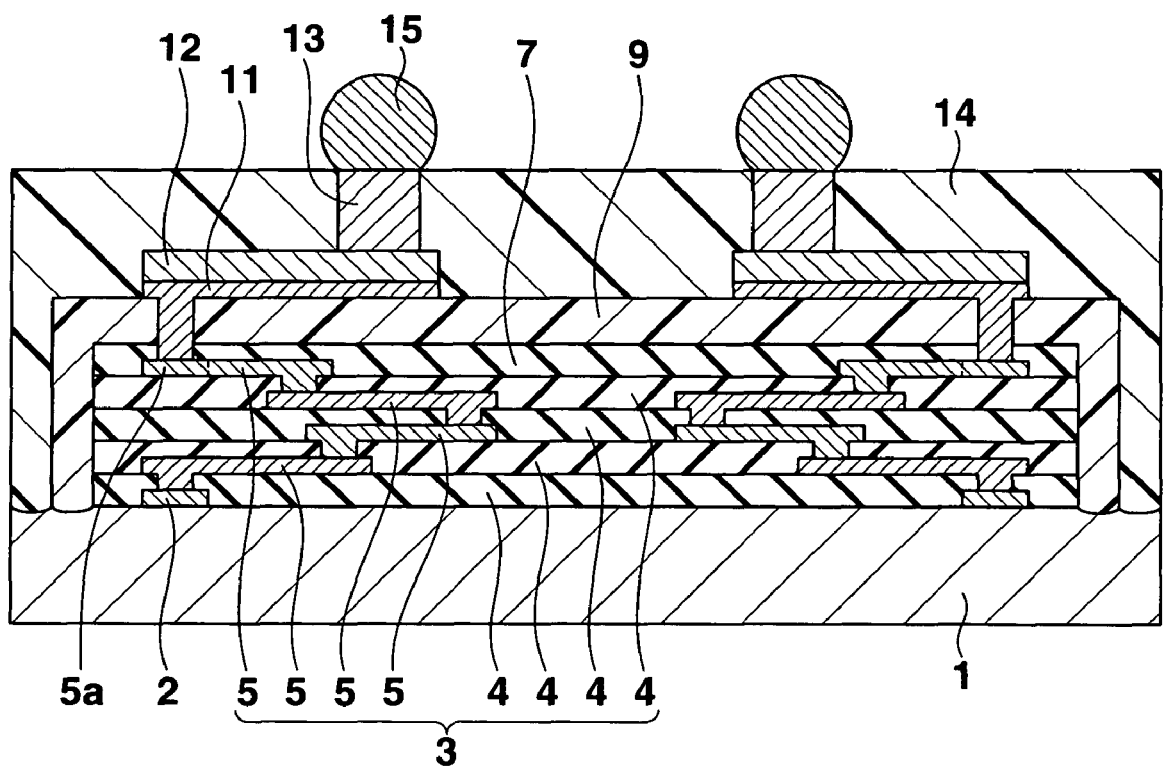
FIG. 12 is a sectional view of a semiconductor device as a second embodiment of the present invention.

FIG. 12 shows a sectional view of a semiconductor device as a second embodiment of the present invention. This semiconductor device is different from the semiconductor device shown in FIG. 1 in that the upper surface and the side surfaces of the passivation film 7 and the side surfaces of the low dielectric film wiring line laminated structure portion 3 are covered with the protective film 9, and the side surfaces of the protective film 9 is covered with the sealing film 14.

Figure 13:
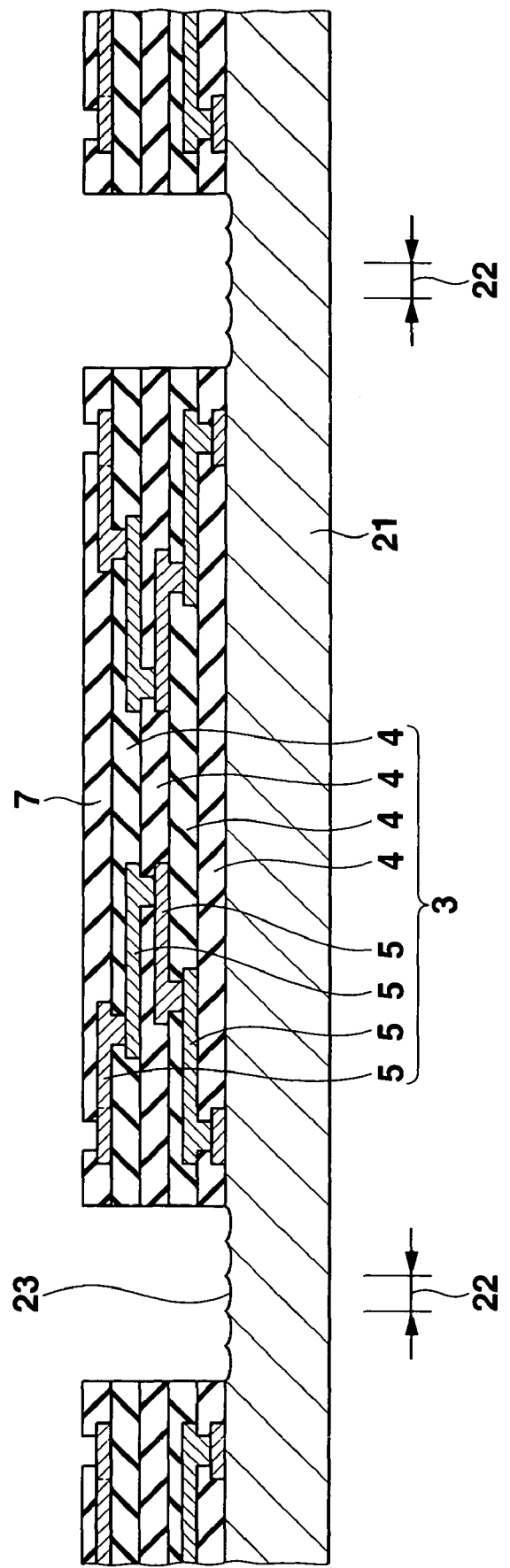
FIG. 13 is a sectional view of an assembly in a predetermined step during manufacturing of the semiconductor device shown in FIG. 12.

As one example of manufacturing this semiconductor device, an assembly shown in FIG. 3 is prepared, and then, as shown in FIG. 13, by laser processing which emits a laser beam, the grooves 23 are formed in the passivation film 7 and four layers of the low dielectric films 4 in regions of the dicing streets 22 and regions on opposite sides of the streets.

In this state, the upper surfaces of a semiconductor wafer 21 in the dicing streets 22 and the regions on opposite sides of the streets are exposed via the grooves 23. Moreover, units which are laminated on the semiconductor wafer 21 and which are each constituted of four layers of the low dielectric films 4 and the passivation film 7 are separated from one another along the grooves 23. In consequence, a plurality of low dielectric film wiring line laminated structure portions 3 shown in FIG. 13 are formed on the semiconductor wafer 21.

Figure 14:
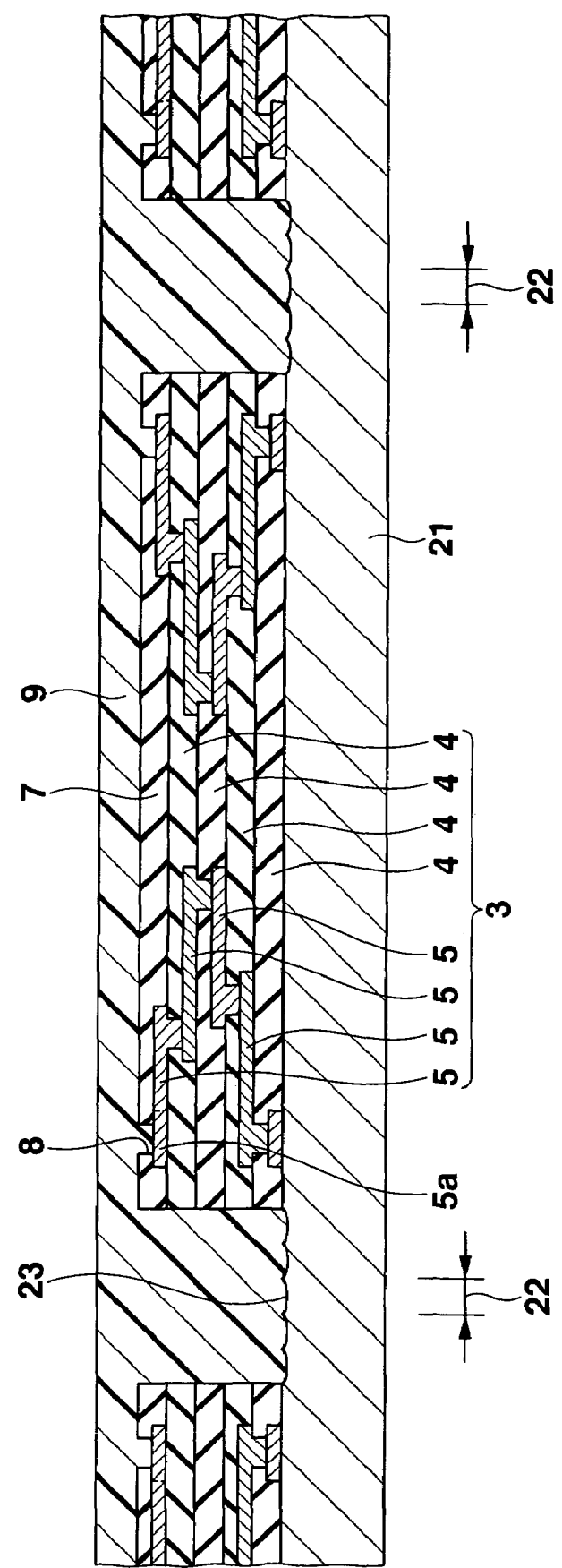
FIG. 14 is a sectional view of an assembly in a step subsequent to FIG. 13.

Next, as shown in FIG. 14, by a screen printing process, a spin coating process or the like, the protective film 9 made of an organic material such as a polyimide-based resin is formed on the upper surfaces of the connection pad portions 5a of the wiring lines 5 of the uppermost layer exposed via the openings 8 of the passivation film 7, on the upper surface of the passivation film 7, and on the upper surfaces of portions of the semiconductor wafer 21 exposed via the grooves 23.

Figure 15:
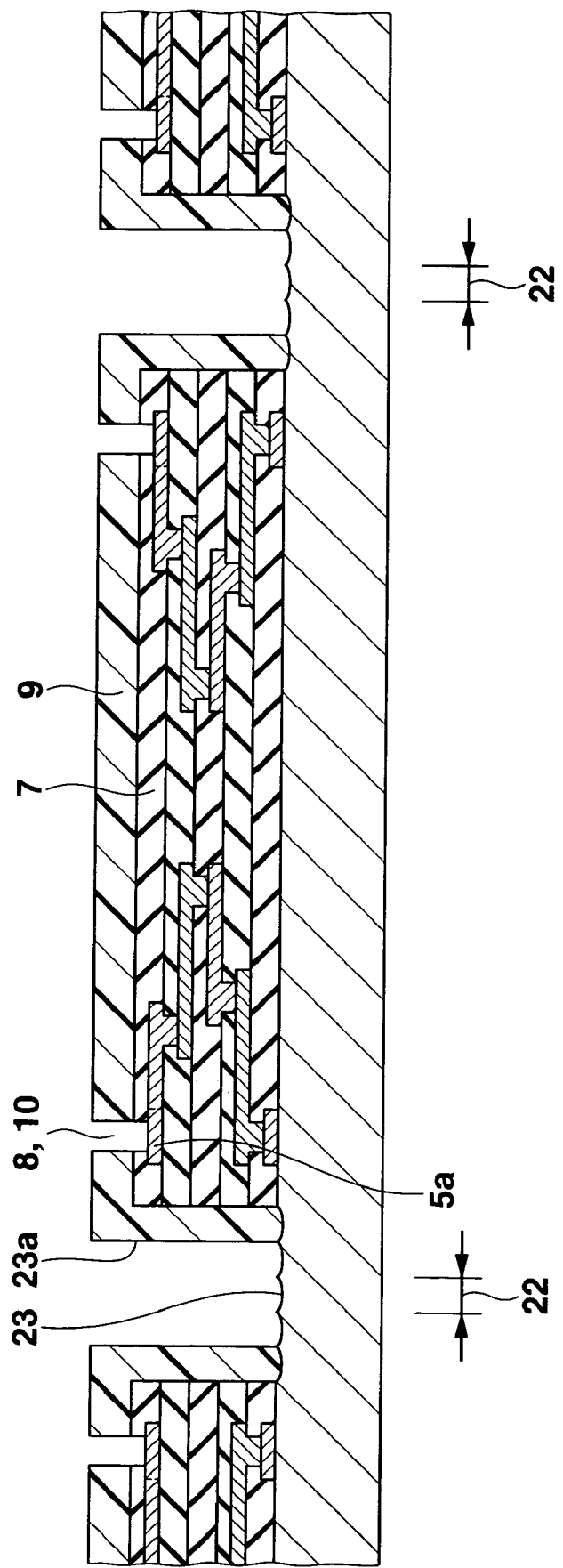
FIG. 15 is a sectional view of an assembly in a step subsequent to FIG. 14.

Next, as shown in FIG. 15, by laser processing which emits a laser beam or cut processing using a dicing blade, grooves 23a slightly narrower than the aforementioned grooves 23 are formed in the protective film 9 in the regions of the dicing streets 22 and the regions on opposite sides of the streets, and openings 10 are formed in portions of the protective film 9 corresponding to the openings 8 of the passivation film 7. Since the subsequent steps are similar to the steps of FIG. 5 et seq. of the first embodiment, description thereof is omitted.

Third Embodiment

Figure 16:
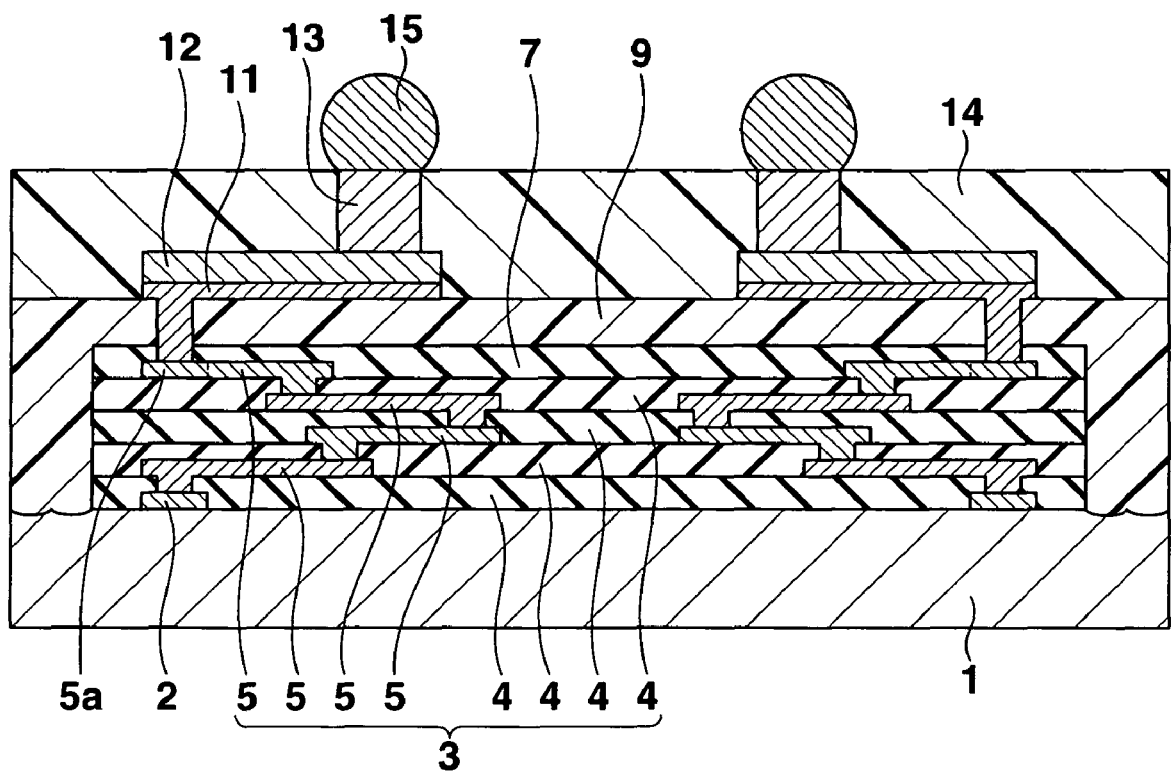
FIG. 16 is a sectional view of a semiconductor device as a third embodiment of the present invention.

FIG. 16 shows a sectional view of a semiconductor device as a third embodiment of the present invention. The third embodiment is different from the second embodiment in that the protective film 9 which covers the upper surface and the side surfaces of the passivation film 7 and the side surfaces of the low dielectric films 4 is extended to the same plane as that of the side surface of the silicon substrate 1. To obtain this structure, the concave portions or grooves 23 shown in FIG. 15 of the second embodiment may completely be filled with the protective film 9.

The above embodiments each has a structure in which the metallic underlayers 11 is formed on the protective film 9, the upper layer wiring lines 12 are respectively formed on this metallic underlayers, and the columnar electrodes 13 are formed on the connection pad portions of the upper layer wiring lines 12. However, the present invention may also be applied to a structure in which connection pad portions connected to the connection pad portions 5a of the wiring lines 5 of the uppermost layer are directly formed on the protective film 9, and bump electrodes for external connection such as the solder balls 15 are formed on the connection pad portions.

Fourth Embodiment

Figure 17:
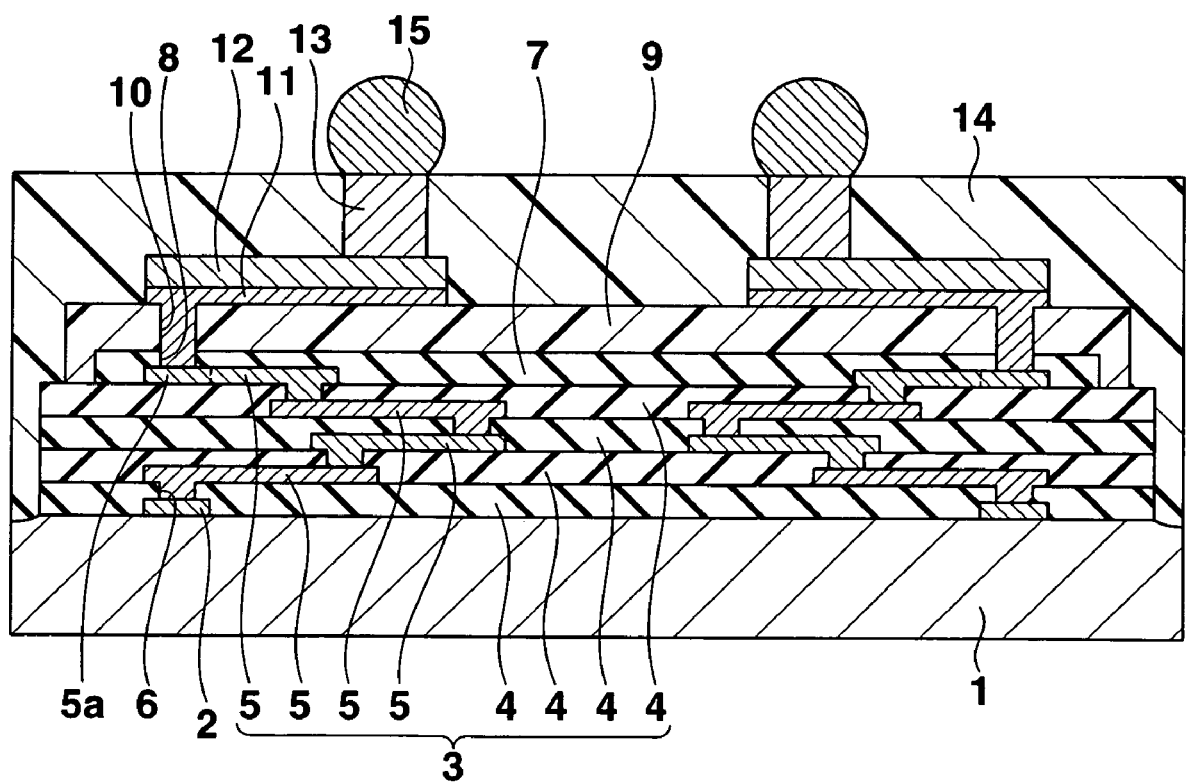
FIG. 17 is a sectional view of a semiconductor device according to a fourth embodiment of the present invention.

FIG. 17 is a sectional view of a semiconductor device according to a fourth embodiment of this invention. The fourth embodiment is similar in structure to the first embodiment. Therefore, only the different features from the first embodiment will be described, and the features common to the first embodiment will not be described. The fourth embodiment differs from the first embodiment in that the passivation film 7 and the protective film 9 are smaller than the low-dielectric film wiring line laminated structure portion 3, on which both films 7 and 9 are formed. That is, the passivation film 7 is smaller than the laminated structure portion 3 and provided on the portion 3, and the protective film 9 is smaller than the laminated structure portion 3 and provided on the entire passivation film 7 and on the peripheral edge of the portion 3. This semiconductor device can be manufactured by the following method. First, the passivation film 7 is formed on the entire surface of the portion 3 as shown in FIG. 2. The passivation film 7 is patterned by means of photolithography. Next, the protective film 9 is formed on the passivation film 7 and on the low dielectric film 4, i.e. the uppermost layer of the low-dielectric film wiring line laminated structure portion 3. Then, the protective film 9 is patterned by means of photolithography. Thereafter, the laser beam is applied to the portion 3, making grooves 23. In this method according to the fourth embodiment, only the low-dielectric film wiring line laminated structure portion 3 is processed with laser beams. Neither the passivation film 7 nor the protective film 9 is processed. Optimal laser-beam process conditions can therefore be set for the processing of the portion 3, and particularly the low dielectric film 4. Hence, the low dielectric film 4 can be processed with high precision.

In the embodiments described above, four low dielectric layers 4 and four wiring lines 5 constitute each low-dielectric film wiring line laminated structure portion 3. The number of low dielectric layers and that of wiring lines are not limited to four. As may be understood from the foregoing, it is sufficient for the portion to have a plurality of low dielectric layers and a plurality of wiring lines.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
a semiconductor substrate;
a plurality of low dielectric film wiring line laminated structure portions which are provided in regions on the semiconductor substrate except peripheral portions thereof, each of the low dielectric film wiring line laminated structure portions comprising a laminated structure of a plurality of low dielectric films and a plurality of wiring lines including an uppermost wiring line having first connection pad portions;
an insulating film provided on an upper side of each of the low dielectric film wiring line laminated structure portions;
a plurality of second connection pad portions for electrodes, which are arranged on the insulating films and electrically connected to the corresponding first connection pad portions of the uppermost wiring lines of the low dielectric film wiring line laminated structure portions;
a plurality of bump electrodes for external connection, provided on the second connection pad portions for the electrodes; and
a sealing film provided on each insulating film and on each peripheral portion of the semiconductor substrate,
wherein the sealing film covers side surfaces of the bump electrodes, and side surfaces of a structure including the low dielectric film wiring line laminated structure portions and the insulating films.

2. The semiconductor device according to claim 1, wherein side surfaces of each low dielectric film wiring line laminated structure portion are covered with the corresponding insulating film.

3. The semiconductor device according to claim 2, wherein side surfaces of each insulating film are covered with the sealing film.

4. The semiconductor device according to claim 1, wherein side surfaces of an insulating film and a corresponding low dielectric film wiring line laminated structure portion substantially form one plane.

5. The semiconductor device according to claim 1, wherein each of the low dielectric films comprises a material having a relative dielectric constant of 1.5 to 3.9.

6. The semiconductor device according to claim 1, wherein each insulating film comprises a passivation film and a protective film provided on the passivation film.

7. The semiconductor device according to claim 6, wherein the passivation film includes one of a silicon oxide film and a low dielectric film.

8. The semiconductor device according to claim 1, wherein the second connection pad portions for the electrodes are formed on each insulating film.

9. The semiconductor device according to claim 8, wherein the bump electrodes for external connection formed on the second connection pad portions for the electrodes are columnar.

10. The semiconductor device according to claim 9, wherein solder balls are respectively provided on the bump electrodes for external connection.

11. The semiconductor device according to claim 1, wherein each of the low dielectric films contains at least one of ethylene fluoride, polyimide fluoride, polyolefin, polyimide resin to which fillers are added, benzocyclobutene (BCB) and an organic polymer-based low-k material.

12. The semiconductor device according to claim 1, wherein each of the low dielectric films has a relative dielectric constant of 3.9 to 1.5.

13. The semiconductor device according to claim 12, wherein each of the low dielectric films has a relative dielectric constant of 2.5 to 3.9.

14. A semiconductor device comprising:
a semiconductor substrate;
a plurality of low dielectric film wiring line laminated structure portions which are provided in regions of the semiconductor substrate except peripheral portions thereof, each of the low dielectric film wiring line laminated structure portions comprising a laminated structure of a plurality of low dielectric films and a plurality of wiring lines including an uppermost wiring line having first connection pad portions;
an insulating film provided on each low dielectric film wiring line laminated structure portion and made of an inorganic resin;
a plurality of second connection pad portions for electrodes, arranged on the insulating films and respectively connected to the corresponding first connection pad portions of the uppermost wiring lines of the low dielectric film wiring line laminated structure portions;
a plurality of bump electrodes for external connection, provided on the second connection pad portions for the electrodes; and
a sealing film provided on each insulating film and on each peripheral portion of the semiconductor substrate,
wherein each of the low dielectric films contains at least one of ethylene fluoride, polyimide fluoride, polyolefin, polyimide resin to which fillers are added, benzocyclobutene (BCB) and an organic polymer-based low-k material; and
wherein the sealing film covers side surfaces of the bump electrodes, and side surfaces of a structure including the low dielectric film wiring line laminated structure portions, and the insulating films.

15. A semiconductor device comprising:
a semiconductor substrate;
a low dielectric film wiring line laminated structure portion which is provided in a region on the semiconductor substrate except a peripheral portion thereof, the low dielectric film wiring line laminated structure portion comprising a laminated structure of a plurality of low dielectric films and a plurality of wiring lines including an uppermost wiring line having a first connection pad portion;
a passivation film comprising an inorganic insulating film provided on the low dielectric film wiring line laminated structure portion;
a protective film made of an organic resin formed on the passivation film;
a second connection pad portion for an electrode arranged on the protective film and connected to the first connection pad portion of the uppermost wiring line of the low dielectric film wiring line laminated structure portion;
a bump electrode for external connection, provided on the second connection pad portion for the electrode; and
a sealing film provided above the insulating film and on the peripheral portion of the semiconductor substrate, wherein the sealing film covers side surfaces of the bump electrode, and side surfaces of a structure including the low dielectric film wiring line laminated structure portion and the insulating film.

* * * * *